US010535571B1

(12) United States Patent
Vermeulen et al.

(10) Patent No.: US 10,535,571 B1
(45) Date of Patent: Jan. 14, 2020

(54) WAFER-SCALE TESTING OF PHOTONIC INTEGRATED CIRCUITS USING HORIZONTAL SPOT-SIZE CONVERTERS

(71) Applicant: Acacia Communications, Inc., Maynard, MA (US)

(72) Inventors: Diedrik Vermeulen, Somerville, MA (US); Long Chen, Marlboro, NJ (US); Christopher Doerr, Middletown, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 15/903,586

(22) Filed: Feb. 23, 2018

Related U.S. Application Data

(63) Continuation of application No. 14/103,659, filed on Dec. 11, 2013, now Pat. No. 9,922,887.

(60) Provisional application No. 61/735,702, filed on Dec. 11, 2012.

(51) Int. Cl.
| | |
|---|---|
| *G02B 6/12* | (2006.01) |
| *H01L 21/66* | (2006.01) |
| *G02B 6/122* | (2006.01) |
| *G02B 6/30* | (2006.01) |
| *G01M 11/00* | (2006.01) |
| *G02B 6/34* | (2006.01) |

(52) U.S. Cl.
CPC ............ *H01L 22/10* (2013.01); *G01M 11/30* (2013.01); *G01M 11/37* (2013.01); *G02B 6/1223* (2013.01); *G02B 6/305* (2013.01); *H01L 22/30* (2013.01); *G02B 6/34* (2013.01); *G02B 2006/12195* (2013.01)

(58) Field of Classification Search
CPC ....... H01L 25/167; H01L 22/10; H01L 22/30; G02B 2006/12061; G02B 6/12004; G02B 6/12019; G02B 6/42; G02B 6/1596; G02B 6/1223; G02B 6/1228; G02B 6/34; G02B 6/13; G02B 6/305; G02B 6/122; G02B 6/26; G02B 6/43; G02B 2006/12195; G02B 2006/12147; G01M 11/30; G01M 11/37
See application file for complete search history.

(56) References Cited

U.S. PATENT DOCUMENTS

| | | | |
|---|---|---|---|
| 5,844,929 A | 12/1998 | Lealman et al. | |
| 6,236,669 B1 | 5/2001 | Nakanishi et al. | |
| 8,442,368 B1 | 5/2013 | Reano et al. | |
| 9,922,887 B2 * | 3/2018 | Vermeulen | G01M 11/30 |
| 2001/0055451 A1 * | 12/2001 | Kuhara | G02B 6/4206 385/93 |
| 2005/0194990 A1 | 9/2005 | Gothoskar et al. | |
| 2006/0093362 A1 | 5/2006 | Welch et al. | |

(Continued)

FOREIGN PATENT DOCUMENTS

WO    WO 2012/049273 A1    4/2012

OTHER PUBLICATIONS

Chen et al., Low-Loss and Broadband Cantilever Couplers between Standard Cleaved Fibers and High-Index-Contrast Si3N4 or Si Waveguides. IEEE Photon Tech Lett. 2010;22(23):1744-6.

(Continued)

*Primary Examiner* — Caridad Everhart
(74) *Attorney, Agent, or Firm* — Joseph D'Angelo

(57) ABSTRACT

Disclosed herein are methods, structures, and devices for wafer scale testing of photonic integrated circuits.

8 Claims, 9 Drawing Sheets

(56) References Cited

U.S. PATENT DOCUMENTS

| | | |
|---|---|---|
| 2008/0044128 A1 | 2/2008 | Kish, Jr. et al. |
| 2010/0086255 A1 | 4/2010 | Ishizaka |
| 2012/0207428 A1 | 8/2012 | Roelkens et al. |
| 2012/0250007 A1 | 10/2012 | Na et al. |
| 2013/0209112 A1* | 8/2013 | Witzens ............... G02B 6/2813 398/214 |
| 2014/0111793 A1 | 4/2014 | Asghari et al. |
| 2014/0205234 A1 | 7/2014 | Rong et al. |
| 2015/0214122 A1 | 7/2015 | Vermeulen et al. |

OTHER PUBLICATIONS

Mekis et al., A Grating-Coupler-Enabled CMOS Photonics Platform. IEEE J Sel Topics Quantum Eng. Nov. 29, 2010;17(3):597-608.

Taillaert et al., A compact two-dimensional grating coupler used as a polarization splitter. IEEE Photon Tech Lett. Sep. 2003;15(9):1249-51.

Taillaert et al., Grating Couplers for Coupling between Optical Fibers and Nanophotonic Waveguides. Jap J Appl Phys. Aug. 2006;45(8A):6071-7.

Van Laere et al., Compact Focusing Grating Couplers for Silicon-on-Insulator Integrated Circuits. IEEE Photon Tech Lett. Dec. 2007;19(23):1919-21.

Vermeulen et al., Efficient Tapering to the Fundamental Quasi-TM Mode in Asymmetrical Waveguides. 15$^{th}$ European Conference on Integrated Optics, Cambridge. WeP16. Apr. 7-9, 2010. 2 pages.

Vermeulen et al., High-efficiency fiber-to-chip grating couplers realized using an advanced CMOS-compatible silicon-on-insulator platform. Opt Express. Aug. 2010;18(17):18278-83. doi: 10.1364/OE.18.018278.

* cited by examiner

WAFER-SCALE TESTING OF PHOTONIC INTEGRATED CIRCUITS USING HORIZONTAL SPOT-SIZE CONVERTERS

CROSS REFERENCE TO RELATED APPLICATIONS

This application is a continuation claiming the benefit of U.S. application Ser. No. 14/103,659, filed Dec. 11, 2013, entitled "WAFER-SCALE TESTING OF PHOTONIC INTEGRATED CIRCUITS USING HORIZONTAL SPOT-SIZE CONVERTERS." which claims the benefit of U.S. Provisional Patent Application Ser. No. 61/735,702 filed Dec. 11, 2012, both of which are incorporated herein by reference in their entireties.

TECHNICAL FIELD

This disclosure relates generally to techniques, methods, apparatus, structures and materials pertaining to wafer-scale testing of photonic integrated circuits.

BACKGROUND

Contemporary optical communications and other photonic systems make extensive use of photonic integrated circuits that are advantageously mass-produced in/over semiconductor substrates—i.e., wafers. Accordingly, techniques, methods, apparatus and structures that improve wafer-scale testing of such circuits would represent a welcome addition to the art.

SUMMARY

An advance in the art is made according to an aspect of the present disclosure directed to techniques, methods, apparatus, structures and materials that enhance the wafer-scale testing of photonic integrated circuits.

BRIEF DESCRIPTION OF THE DRAWING

A more complete understanding of the present disclosure may be realized by reference to the accompanying drawings in which.

DETAILED DESCRIPTION

Figure 1:
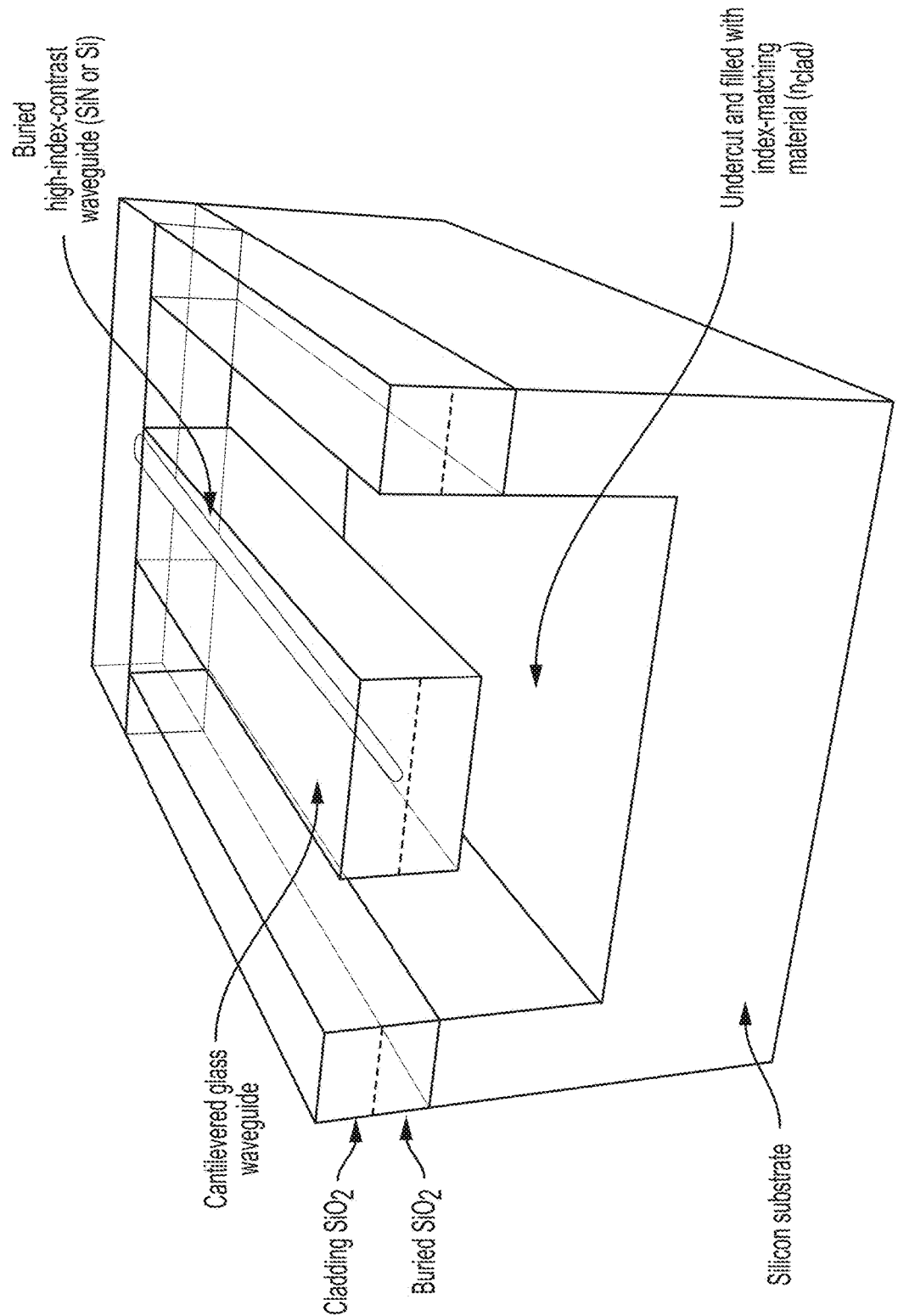
FIG. 1 shows a schematic illustration of a horizontal spot-size converter using a low-index contrast intermediate waveguide to couple light from a small-core Si waveguide to an optical fiber.

The following merely illustrates the principles of the disclosure. It will thus be appreciated that those skilled in the art will be able to devise various arrangements which, although not explicitly described or shown herein, embody the principles of the disclosure and are included within its spirit and scope. More particularly, while numerous specific details are set forth, it is understood that embodiments of the disclosure may be practiced without these specific details and in other instances, well-known circuits, structures and techniques have not be shown in order not to obscure the understanding of this disclosure.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

By way of some additional background, we begin by noting that a number of techniques exist for coupling light into and out of photonic integrated circuits (PICs). As part of that coupling—and as may be appreciated—one oftentimes desires to interface a PIC with a single-mode optical fiber. Unfortunately however, for photonic integration platforms such as Silicon Photonics that employ high-index contrast waveguides, the mode-size of a single-mode waveguide (~0.1 µm$^2$) is only a fraction of the mode-size of single-mode optical fiber (~100 µm$^2$). Accordingly, this differential creates a need for low-loss, on-chip, spot-size converters to facilitate such coupling.

One known method to achieve this coupling is to incorporate low index contrast waveguides using $SiO_2$ or $Si_3N_4$ as in intermediate waveguide between the high-index-contrast, small-core Si waveguide on the PIC and the optical fiber.

An inverted taper may be used to couple the high-index contrast waveguide to the low-index contrast waveguide as shown schematically in FIG. 1. This intermediate waveguide exhibits a spot-size of the same order as an optical fiber and low-loss coupling can thus be achieved by horizontal butt-coupling. Illustrated in that schematic of FIG. 1 is a silicon substrate onto which is constructed buried $SiO_2$, cladding $SiO_2$ and a buried high-index-contrast waveguide (e.g., SiN or Si) undercut and filled with index-matching material ($n_{clad}$).

Figures 2A, 2B:
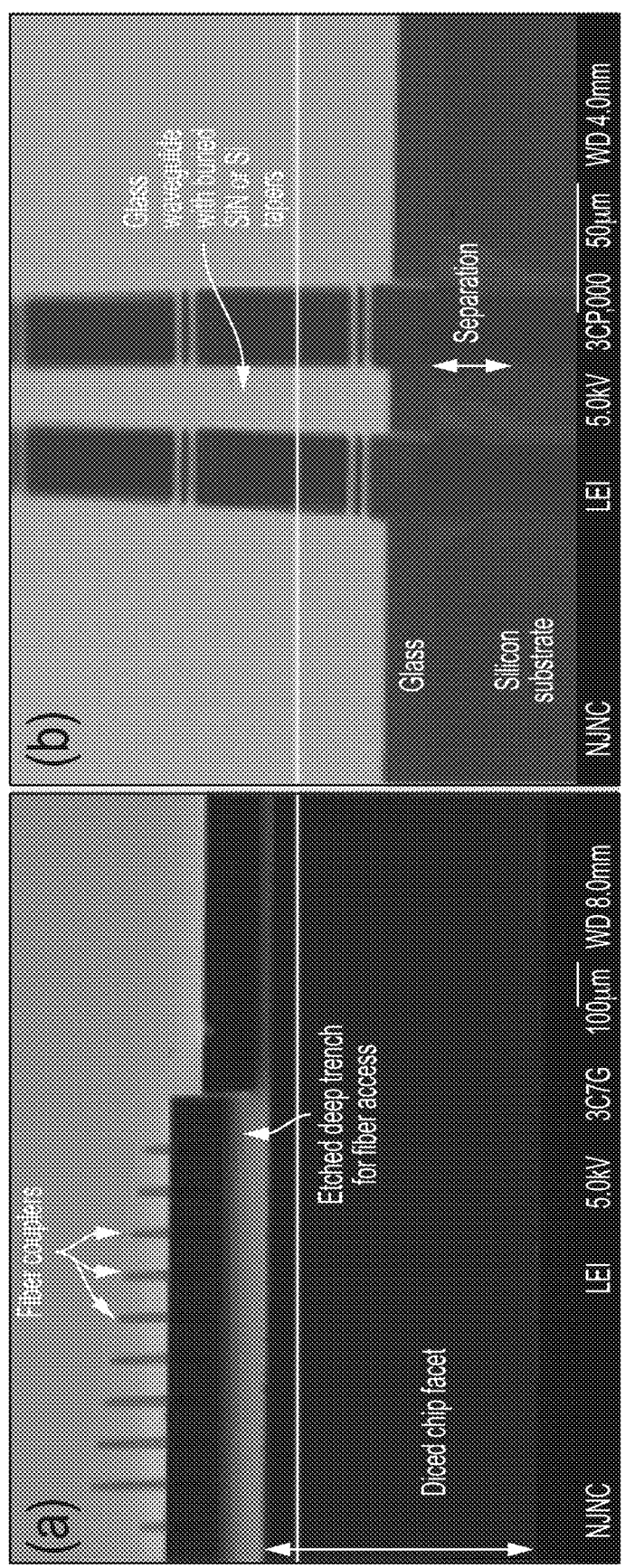
FIGS. 2A and 2B show a schematic illustration of an intermediate low index contrast waveguide formed using a deep trench etch wherein the end facet is formed using the same deep trench etch and is offset with the dicing cut.

Horizontal coupling using an inverted adiabatic Si taper and intermediate low index contrast waveguide is adiabatic and therefore efficient over a broad wavelength range. Advantageously, it also exhibits a low polarization dependency, depending upon the feature size of the tip of the inverted Si taper. One difficulty encountered with such coupling however, is that it requires a wafer upon which the PIC is formed to be diced before the spot-sized converter can be used. This characteristic therefore makes it impossible to perform wafer scale testing since light cannot be coupled out-of-plane thereby considerably increasing test time and test cost. Yet another difficulty with this type of coupling is that the intermediate waveguide needs to have a clean polished facet. This may be overcome by using a deep-etch step to form a smooth facet at the intermediate waveguide instead of relying on the dicing or cleaving of the chip. The etched facet is then offset with respect to the dicing cut introducing a small longitudinal gap of a few micrometers between the waveguide and the fiber facet. This longitudinal gap has a negligible effect of the coupling efficiency. Such waveguide facet formation using the deep trench is shown schematically in FIGS. 2A and 2B.

Instead of using a deep-etch step to form the facet of the intermediate waveguide, one can omit the deep-etch and dice or cleave through the intermediate waveguide. However, when the intermediate waveguide is suspended and only supported by a limited amount of support structures (see FIG. 1), this dicing or cleaving can mechanically damage the intermediate waveguide. As used herein, suspended means that the material, typically of higher refractive index than the intermediate waveguide core, is etched away under the waveguide to decrease waveguide loss. One way to avoid damaging the suspended waveguide is to not suspend the waveguide at the position where it will be diced. This will increase the intermediate waveguide loss at that point but will make it mechanically stable to survive the dicing process. All of the following discussions therefore are not limited to chips that have a deep etch to form the intermediate waveguide facet.

With this additional background in place, we now note that the present disclosure describes techniques, methods, apparatus and structures that permit the wafer test of integrated photonic circuit. More particularly, out-of-plane fiber-to-waveguide spot-size converters using diffraction gratings—commonly known as grating couplers.

Such grating couplers are useful coupling structures for wafer-scale testing purposes and can be placed anywhere on a chip wafer. Furthermore they may be fabricated to be ultra-compact (i.e., 30 µm×30 µm) by curving the grating and focusing the light in-plane. The coupling efficiency of such grating couplers may be made very consistent and therefore they are ideal candidates for optical testing purposes. Additionally, 1D grating couplers are highly polarization dependent due to the birefringence of the Si waveguides and therefore act as a coupler and polarization filter exhibiting an extinction ratio of around 50 dB.

As may be appreciated, grating couplers may be designed for coupling to the TE or TM polarized mode in the optical waveguide. More advanced polarization splitting grating couplers using 2D gratings may be used to couple both polarizations at the same time and by increasing the directionality of the grating, highly efficient fiber coupling may be achieved. One drawback to such grating couplers is that they couple light intrinsically in a wavelength dependent manner. It is also difficult to achieve a better than 3 dB insertion loss for polarization splitting grating couplers. This is one reason why in some applications adiabatic spot-size converters are preferred even though they cannot generally be used for wafer-scale optical measurement. Even if a grating coupler is used to test a copy of a sub-component or even the whole circuit, but this is no guarantee that the actual circuit will work and will require valuable room on the reticle.

Figure 3:
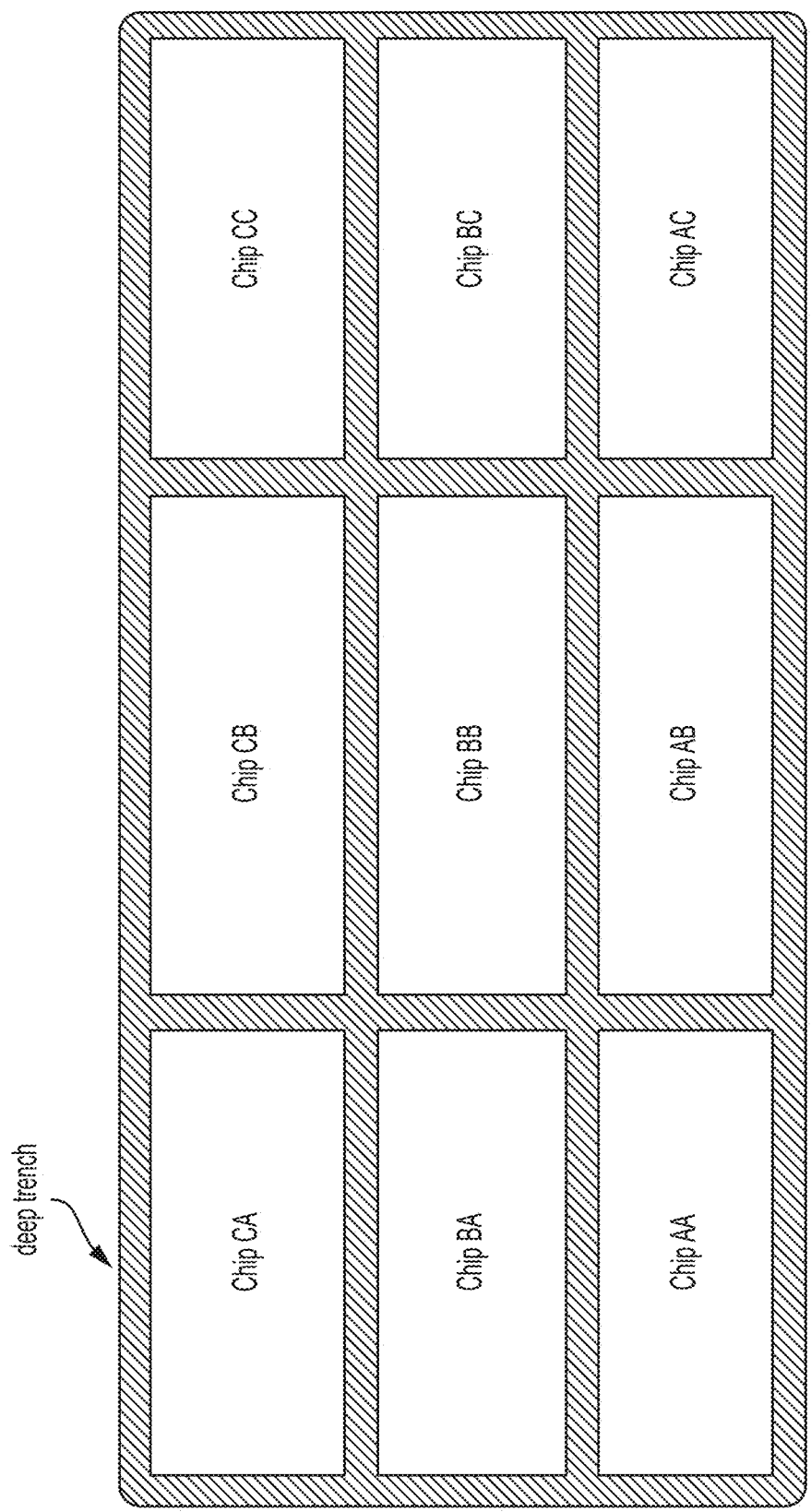
FIG. 3 shows a schematic illustration of a chip layout of a reticle on a wafer wherein deep trench etch lines divide the chips.

According to an aspect of the present disclosure, we solve these problems by using a combination of grating couplers and horizontal spot-size converters to couple to the horizontal spot-size converter that may be used for fiber coupling of the packaged PIC. One exemplary chip layout of a reticle on a wafer is shown schematically in FIG. 3.

As depicted in that schematic of an exemplary chip layout of a reticle on a wafer, deep trench etch lines are shown dividing the individual chips (AA, BA, CA, AB, BC, CC, AC, BC, and CC). The deep trench etches have a width wider than a dicing blade thickness (i.e., ~50 µm). These deep trench etches also provide an etch for the facet of the intermediate waveguide for the horizontal spot-size converters.

In order to test the horizontal spot-size converters or inverted taper fiber couplers (ITFC) of—for example chip BB—a test circuit on chip CB may be used which uses identical ITFCs to couple to a test circuit and subsequently to grating couplers as out of plane optical interfaces. This advantageously enables wafer-scale testing of the complete circuit including the horizontal couplers that will be used for the device after packaging.

Figure 4:
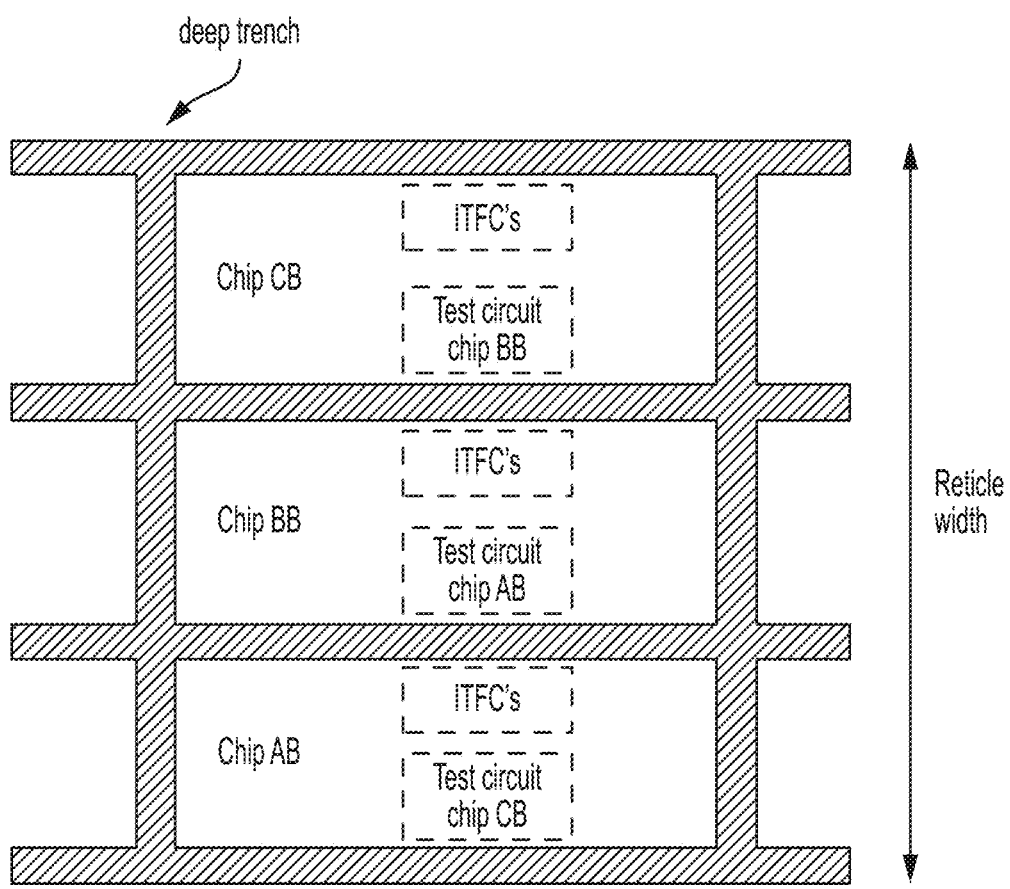
FIG. 4 shows a schematic illustration of an exemplary chip layout and positioning of inverted taper fiber couplers and the complementary test circuits on the adjacent chip according to the present disclosure.

One such an arrangement is shown schematically in FIG. 4. More specifically, in this FIG. 4 it is schematically shown how a complementary test circuit is placed on an adjacent chip.

Figure 5:
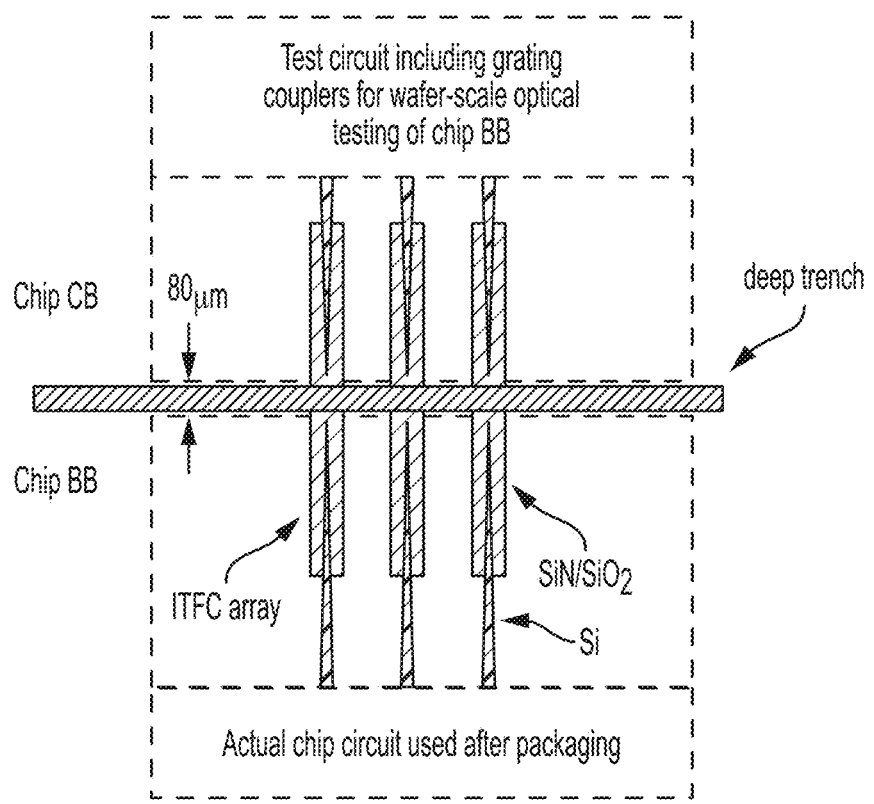
FIG. 5 shows a schematic illustration of a complementary test circuit of chip BB on chip CB that are shown in FIG. 4 according to an aspect of the present disclosure.
Figure 6:
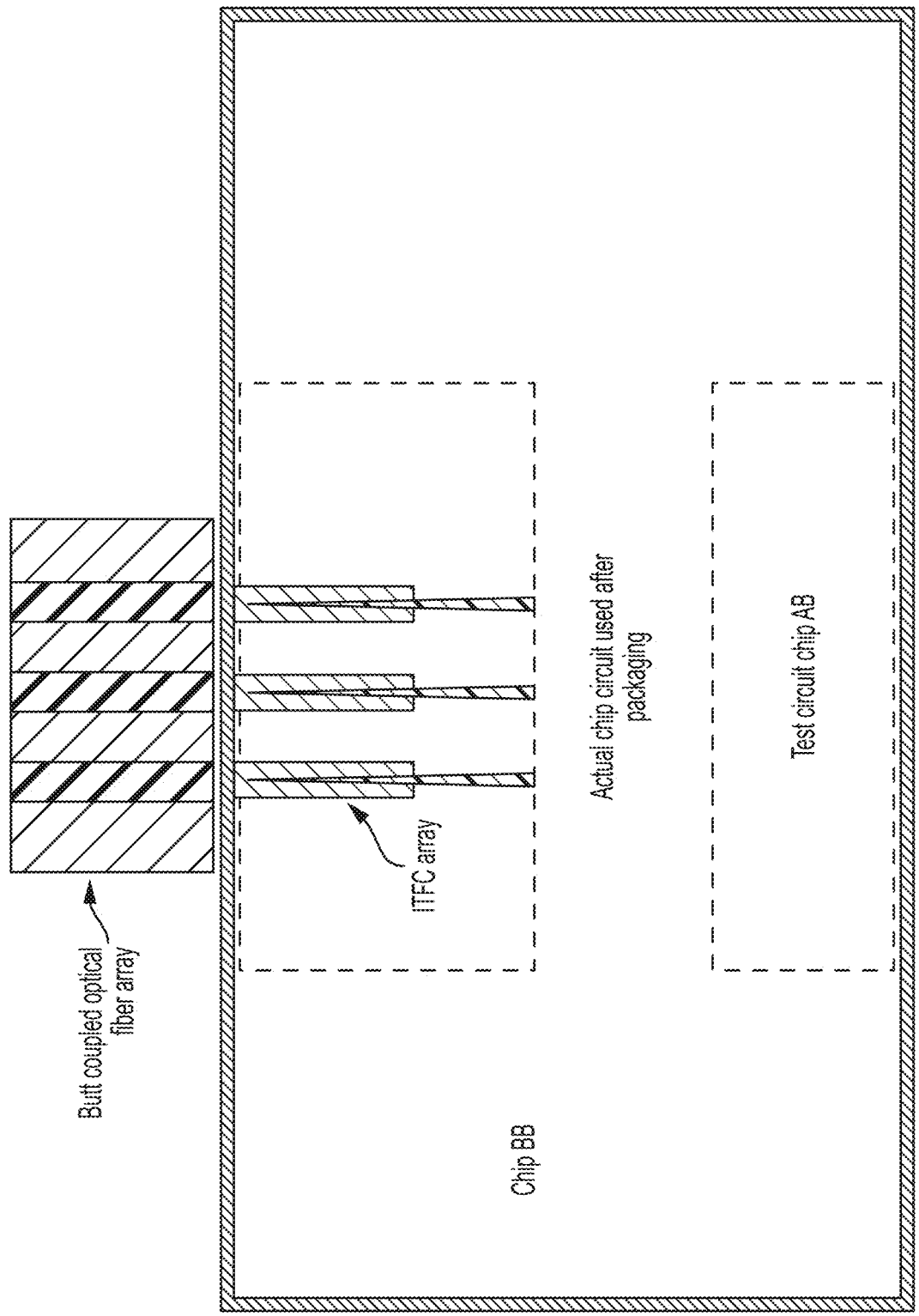
FIG. 6 shows a schematic illustration of a diced and packaged chip with butt coupled optical fiber array according to an aspect of the present disclosure.

With reference now to FIG. 5, there it shows in schematic form a somewhat more detailed depiction of an inverted taper fiber coupler (ITFC) array on chip BB and a test circuit on chip CB which includes an identical ITFC array to couple to the test circuit containing the grating couplers. As may now be appreciated and according to an aspect of the present disclosure, this test circuit will be used during wafer scale testing. Thereafter, the wafer is diced and working chips are packaged as shown schematically in FIG. 6, and an optical fiber array is then used to butt couple to the tested ITFC array.

One particular feature that needs to be addressed is the coupling efficiency loss between the test structure and the actual circuit due to a longitudinal gap loss between the horizontal spot size converters at opposite sides of a wide deep trench line of around 80 microns. If we estimate the gap loss by using conventional formulas for longitudinal gap misalignment loss $\alpha_i$ for the splicing of single-mode optical fibers as:

$$\alpha_i = 10\log[1 + \tilde{D}^2]$$
$$\tilde{D} = \frac{D\lambda_0}{2\pi n_l w}$$

with $\lambda_0$ the wavelength of the light, w the beam width of the optical fiber and $n_1$ is refractive index of the gap material.

Figure 7:
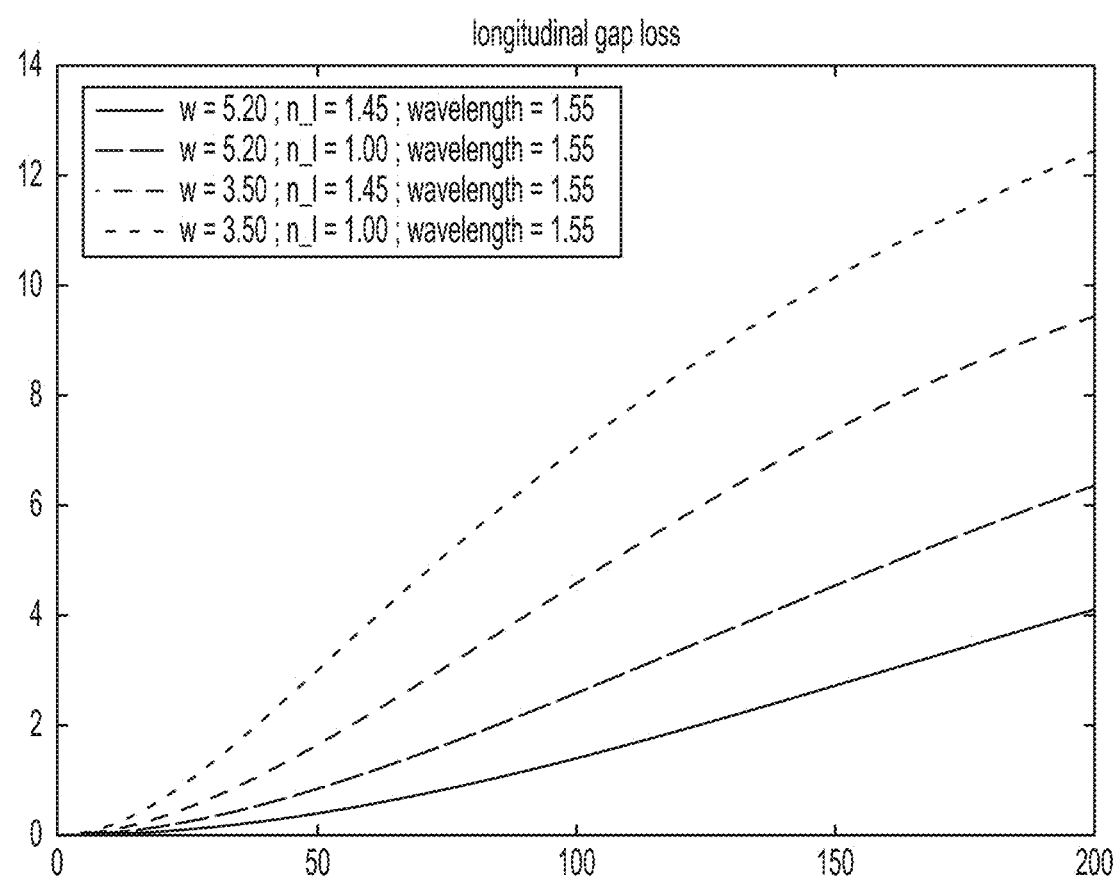
FIG. 7 shows a graph depicting longitudinal gap loss from butt coupling of optical fibers with a Gaussian beam with of w for wavelength 1.55 microns wherein refractive index of material in the gap is denoted by $n\_1$ according to an aspect of the present disclosure.

With reference now to FIG. 7, there it may be observed that gap loss as a function of the gap width is plotted for different beam widths and gap materials. For an 80 micron gap, the gap loss ranges from 1 dB to 7 dB depending upon Gaussian beam width and gap material. For a normal single-mode fiber with w=5.2 microns and an air gap, the expected loss is around 2 dB. This loss can be reduced by, for example, filling the gap with index matching fluid making a focusing end facet at the test circuit waveguide, reducing the gap width altogether or by extruding the low index contrast waveguide at the test circuit side.

Figure 8:
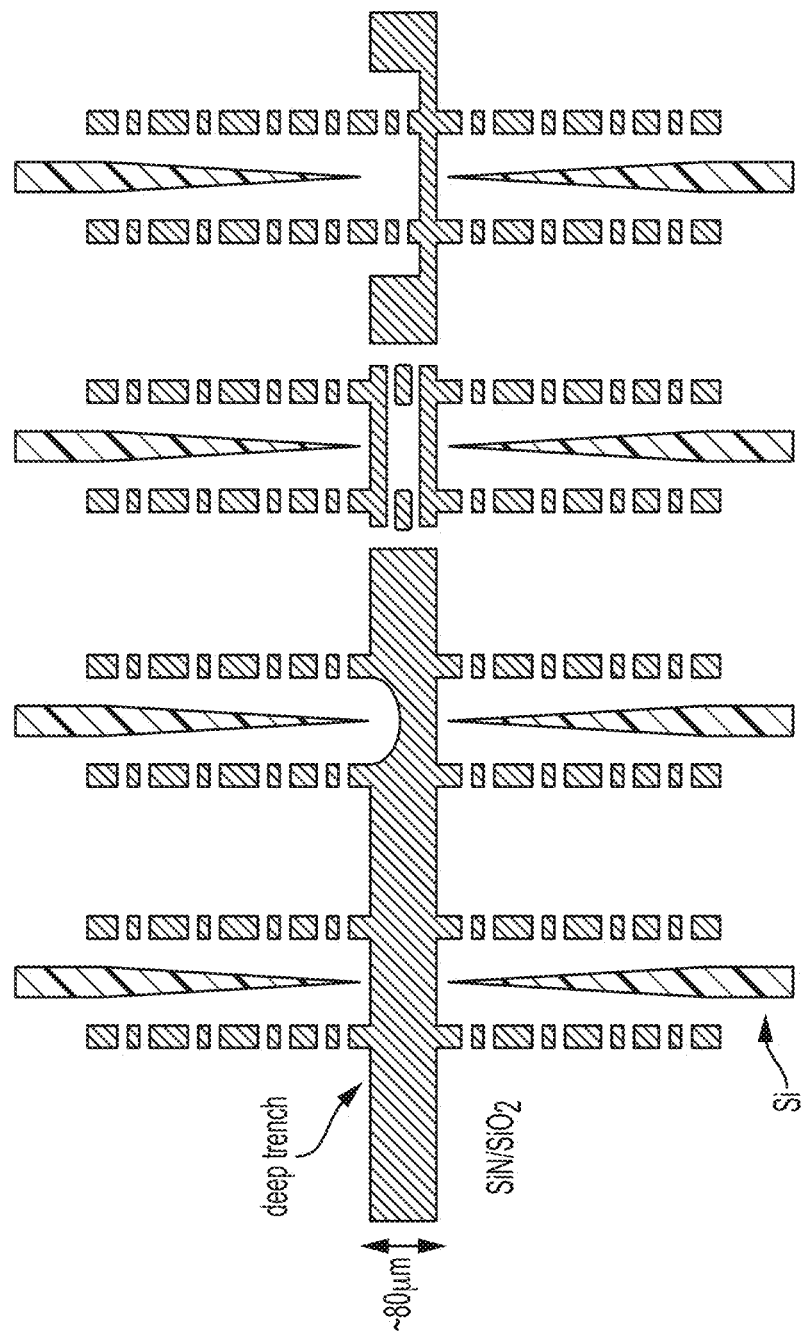
FIG. 8 shows a schematic illustration of examples of optical loss reduction using intermediate or focusing structures to prevent high loss from light diffraction wherein the gaps may be optimized for optimal coupling and low reflection and may be filled with an index matching fluid to reduce diffraction and reflections according to an aspect of the present disclosure.

FIG. 8 shows in schematic form examples of optical loss reduction using intermediate or focusing structures to prevent high loss from light diffraction. The gaps shown in the figure may be optimized for optimal coupling and low reflection and may also be filled with an index matching fluid to reduce diffraction and reflections. An important aspect of structures according to the present disclosure is that the coupling efficiency sufficiently deterministic and robust such that it may be considered when testing the circuit.

If the case the intermediate or low index contrast waveguide is not etched to form a facet, there is no gap between the complementary waveguides on the device and the test circuit. But, the waveguide will be not suspended and a deterministic amount of light will leak to the substrate. In this case is crucial to minimize the section where the waveguide is not suspended to minimize the optical loss.

As may now be appreciated, besides the complementary horizontal spotsize converters, there are a number of possible arrangements for test circuits. More specifically, test circuits may include 1 D TE/TM or 2D grating couplers, polarization combiners and polarization rotators. It may also include reference waveguides to measure the performance of the grating coupler itself or of other structures used in the test circuit.

Other functionalities such as a reflective structure can be added in the test circuit in order to determine the reflection points in the circuit. Alternatively, phase shifters may be added to test phase response.

One possible variation includes an integrated polarization rotator in the test circuit using phase shifters, variable optical attenuators (VOAs) or tunable switches, polarization combiners and/or rotators. In this manner, polarization dependent loss (PDL) of the circuit may be tested without the need of an external polarization rotator. The circuit may also be self-monitoring using—for example—integrated photodetectors.

As may be readily appreciated, since the test circuit is diced off its particular functionality is somewhat irrelevant and great design freedom is achieved.

Figure 9:
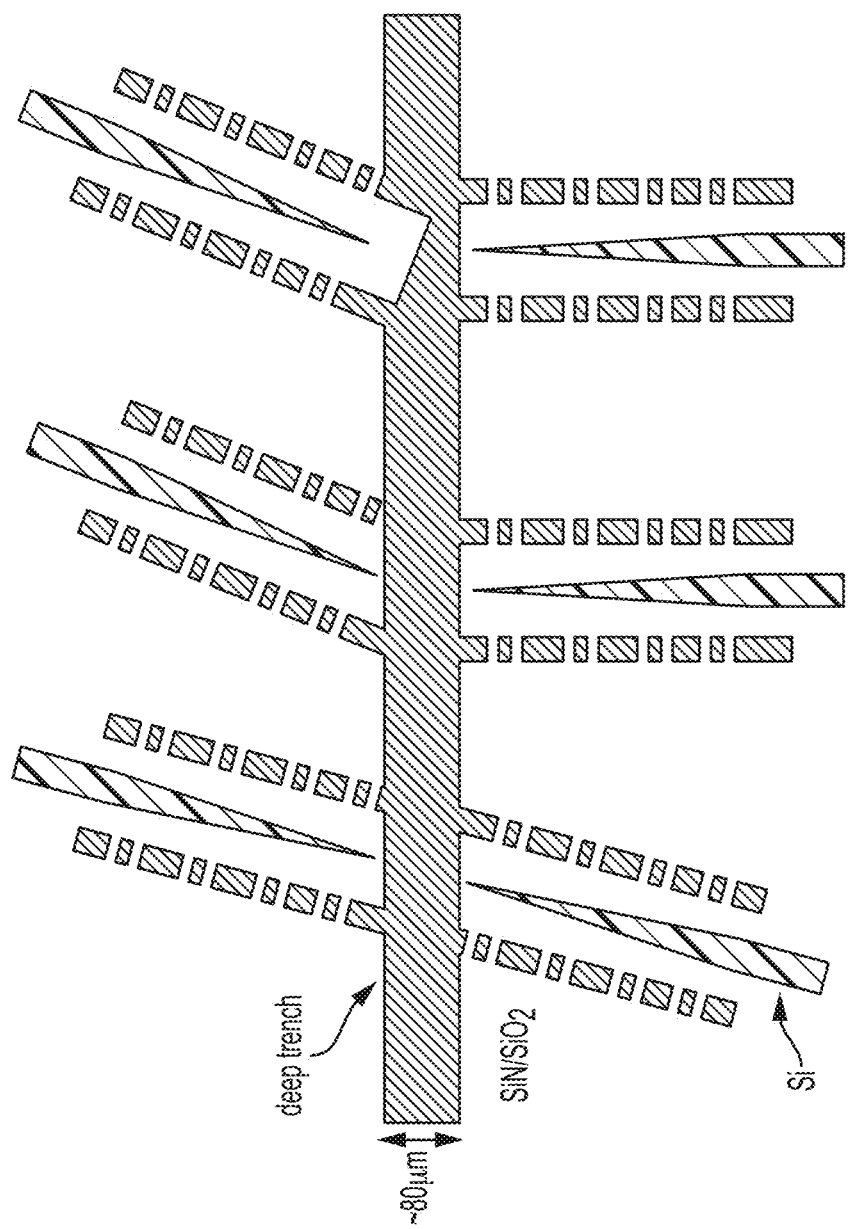
FIG. 9 shows a schematic illustration depicting angled facets for both or for one ITFC such that the reflection is eliminated if the refractive index of gap material is different from intermediate waveguide according to an aspect of the present disclosure.

Finally, and with reference now to FIG. 9, there is shown a schematic of additional variations of coupled horizontal adiabatic couplers separated by a deep trench. As may be appreciated, one problem that may arise is that gap material (preferably air for convenience) is substantially different from the intermediate waveguide material such as SiN or $SiO_2$. This introduces reflections at the waveguide facets. By angling the horizontal facet couplers—such as shown in FIG. 9—either both or one of them—the reflection can be reduced or eliminated altogether. If the facet couplers of the chip are angled, then a complementary angled array for packaging is used.

At this point, those skilled in the art will readily appreciate that while the methods, techniques and structures according to the present disclosure have been described with respect to particular implementations and/or embodiments, those skilled in the art will recognize that the disclosure is not so limited. Accordingly, the scope of the disclosure should only be limited by the claims appended hereto.

The invention claimed is:

1. An apparatus comprising:
a wafer comprising a plurality of photonic integrated circuits;
a first photonic integrated circuit of the plurality of photonic integrated circuits comprising a test circuit;
a second photonic integrated circuit of the plurality of photonic integrated circuits adjacent the first photonic integrated circuit and comprising a horizontal spot-size converter, wherein the horizontal spot-size converter comprises an inverted taper;
wherein the test circuit is configured to test the second photonic integrated circuit via the horizontal spot-size converter.

2. The apparatus of claim 1,
wherein the second photonic integrated circuit comprises an intermediate waveguide optically coupled to the inverted taper;
wherein the inverted taper and the intermediate waveguide are made of different materials.

3. The apparatus of claim 1, wherein the test circuit comprises a grating coupler.

4. The apparatus of claim 1, wherein the test circuit comprises a polarization splitter.

5. The apparatus of claim 1, wherein the horizontal spot-size converter is a first horizontal spot-size converter, and wherein the first photonic integrated circuit further comprises a second horizontal spot-size converter configured to optically couple the test circuit to the first horizontal spot-size converter.

6. The apparatus of claim 1, wherein the wafer comprises silicon.

7. The apparatus of claim 1, wherein the test circuit is configured to optically couple to the horizontal spot-size converter through a trench.

8. The apparatus of claim 7, wherein the horizontal spot-size converter forms an angle with respect to a normal to the trench that is greater than zero.

* * * * *